US010000371B2

(12) United States Patent
Hasunuma et al.

(10) Patent No.: US 10,000,371 B2
(45) Date of Patent: Jun. 19, 2018

(54) CONNECTOR AND SOCKET

(71) Applicant: Surpass Industry Co., Ltd., Saitama (JP)

(72) Inventors: Masahiro Hasunuma, Saitama (JP); Masamichi Kobayashi, Saitama (JP)

(73) Assignee: Surpass Industry Co., Ltd., Saitama (JP)

( * ) Notice: Subject to any disclaimer, the term of this patent is extended or adjusted under 35 U.S.C. 154(b) by 0 days. days.

(21) Appl. No.: 15/380,072

(22) Filed: Dec. 15, 2016

(65) Prior Publication Data

US 2017/0174499 A1    Jun. 22, 2017

(30) Foreign Application Priority Data

Dec. 17, 2015   (JP) ................................ 2015-246449

(51) Int. Cl.
*B67D 7/02*      (2010.01)
*H01L 21/306*    (2006.01)

(52) U.S. Cl.
CPC ......... *B67D 7/0294* (2013.01); *B67D 7/0216* (2013.01); *B67D 7/0255* (2013.01); *H01L 21/30625* (2013.01); *Y10T 137/86541* (2015.04)

(58) Field of Classification Search
CPC .. B67D 7/0294; B67D 7/0255; B67D 7/0216; H01L 21/30625; Y10T 137/86541
See application file for complete search history.

(56) References Cited

U.S. PATENT DOCUMENTS

| 4,437,647 | A   | 3/1984 | Cruse |
| 6,568,427 | B2* | 5/2003 | Imai ................... B67D 7/0283 137/590 |
| 6,886,804 | B2* | 5/2005 | Doi ....................... F16L 37/23 251/149.1 |

(Continued)

FOREIGN PATENT DOCUMENTS

| DE | 4203785 A1    | 8/1993 |
| JP | 2009173326 A  | 8/2009 |
| WO | 2006110541 A2 | 10/2006 |

OTHER PUBLICATIONS

Foreign Communication from a related application—Extended European Search Report of European Application No. 16203190.0, dated May 10, 2017, 10 pages.

(Continued)

*Primary Examiner* — Craig Schneider
*Assistant Examiner* — Kevin Bass
(74) *Attorney, Agent, or Firm* — Conley Rose, P.C.; Keith C. Rawlins

(57) ABSTRACT

Provided is a connector including a plug to be fixed to an inner peripheral surface of an opening of a liquid storing container, and a socket to be detachably attached to the plug. The plug includes a plug body in which a first liquid outflow passage, a first liquid inflow passage, and a first gas passage are formed. The socket includes a socket body including, formed therein, a second liquid outflow passage, a second liquid inflow passage), and a second gas passage; a rotary valve having an outflow through-hole and an inflow through-hole; and a switching mechanism for switching between an open state and a closed state when the rotary valve is rotated.

4 Claims, 14 Drawing Sheets

(56) References Cited

U.S. PATENT DOCUMENTS

| | | | | |
|---|---|---|---|---|
| 8,052,014 | B2* | 11/2011 | Hasegawa | B67D 7/0261 |
| | | | | 137/212 |
| 8,302,618 | B2* | 11/2012 | Takanohashi | B67D 7/0283 |
| | | | | 137/212 |
| 8,381,768 | B2* | 2/2013 | Hasegawa | B67D 7/0261 |
| | | | | 137/212 |
| 8,870,037 | B2* | 10/2014 | Takanohashi | B67D 7/0266 |
| | | | | 137/212 |
| 9,010,352 | B2* | 4/2015 | Takanohashi | B67D 7/0294 |
| | | | | 137/145 |
| 9,126,713 | B2* | 9/2015 | Takanohashi | B67D 7/0294 |
| 9,157,459 | B2* | 10/2015 | Hasunuma | F04F 10/00 |
| 9,517,925 | B2* | 12/2016 | Imai | B65D 41/04 |
| 2002/0020449 | A1 | 2/2002 | Imai | |
| 2006/0243755 | A1 | 11/2006 | Hennen et al. | |
| 2008/0251545 | A1* | 10/2008 | O'Leary | B67B 7/24 |
| | | | | 222/464.1 |
| 2009/0188919 | A1 | 7/2009 | Takanohashi | |
| 2011/0100481 | A1 | 5/2011 | Takanohashi | |

OTHER PUBLICATIONS

Filing receipt and specification for patent application entitled "Connector, Socket, and Liquid Storing Container," by Masahiro Hasunuma, et al., filed Dec. 15, 2016 as U.S. Appl. No. 15/380,100.
Office Action of U.S. Appl. No. 15/380,100 dated Feb. 5, 2018 (15 pages).

* cited by examiner

CONNECTOR AND SOCKET

CROSS-REFERENCE TO RELATED APPLICATIONS

This application is based on Japanese Patent Application No. 2015-246449, the contents of which are incorporated herein by reference in its entirety.

TECHNICAL FIELD

The present disclosure relates to a connector and a socket.

BACKGROUND

A plug and a socket that are attached to a container for storing a liquid, such as a chemical solution, which is used for semiconductor production, are known (for example, see Japanese Unexamined Patent Application, Publication No. 2009-173326).

The plug and the socket that are disclosed in Japanese Unexamined Patent Application, Publication No. 2009-173326 pressurize the inside of the container with a gas supplied from a gas supply tube to the socket, and guide the liquid stored in the container to an outside conduit through a siphon tube, the plug, and the socket.

SUMMARY

Technical Problem

However, the socket disclosed in Japanese Unexamined Patent Application, Publication No. 2009-173326 has a structure in which the liquid circulation state is switched by bringing a valve body, which is disposed at the socket, and a valve seat, which is disposed at the plug, into contact with each other or separating them from each other. Further, the socket has a section where the passage sectional area decreases locally, and includes an urging mechanism for urging the valve body into a closed state. Accordingly, when the liquid is a slurry containing a polishing agent or the like (a slurry in which solid particles are dispersed), the solid particles adhere to the section where the passage sectional area decreases locally, which deteriorates the liquidity of the liquid. Further, when the solid particles adhere to the urging mechanism of the valve body and are coagulated, the valve body cannot be opened or closed smoothly.

The socket disclosed in Japanese Unexamined Patent Application, Publication No. 2009-173326 does not have any mechanism for opening or closing a liquid return passage formed therein. This causes the liquid in the liquid return passage to flow to the outside when the socket is detached from the plug.

The present disclosure has been made in view of the above-mentioned circumstances, and an object of the present disclosure is to provide a socket that prevents deterioration in the liquidity of a liquid stored in a liquid storing container even when the liquid is a slurry containing solid particles, and also prevents the liquid from flowing to the outside when the socket is detached from a plug, and a connector including the socket.

Solution to Problem

To solve the above-mentioned problem, the present disclosure adopts the following solutions.

A connector according to one aspect of the present disclosure is attached to a liquid storing container having an opening formed in an upper surface thereof, the opening being formed with a cylindrical shape about a first axial line, the connector including: a plug to be fixed to the opening; and a socket to be detachably attached to the plug. The plug includes a plug body including, formed therein, a first liquid outflow passage through which a liquid stored in the liquid storing container is drawn out; a first liquid inflow passage that guides the liquid flowing in from an outside of the liquid storing container into the liquid storing container; and a first gas passage that circulates an outside air between an inside space of the liquid storing container and an outside space of the liquid storing container. The socket includes: a socket body including, formed therein, a second liquid outflow passage through which the liquid drawn out from the first liquid outflow passage is caused to flow to the outside; a second liquid inflow passage that guides the liquid flowing in from the outside of the liquid storing container to the first liquid inflow passage; and a second gas passage connected to the first gas passage and causing the outside air to circulate between the inside space and the outside space, the socket body having a columnar insert hole formed along a second axial line so as to penetrate through the second liquid outflow passage and the second liquid inflow passage, the second axial line intersecting with the first axial line; a columnar rotary valve including an outflow through-hole and an inflow through-hole and inserted into the insert hole, the outflow through-hole being formed at a location where the second liquid outflow passage is disposed on the second axial line, the inflow through-hole being formed at a location where the second liquid inflow passage is disposed on the second axial line; and a switching mechanism that rotates the rotary valve about the second axial line and switches between an open state and a closed state, the open state being a state in which the outflow through-hole and the second liquid outflow passage communicate with each other and the inflow through-hole and the second liquid inflow passage communicate with each other, the closed state being a state in which the outflow through-hole and the second liquid outflow passage do not communicate with each other and the inflow through-hole and the second liquid inflow passage do not communicate with each other.

In the connector according to one aspect of the present disclosure, the liquid drawn out from the first liquid outflow passage of the plug is caused to flow to the outside via the second liquid circulation passage by, for example, sucking the liquid by an external pump, in a state where the socket is attached to the plug. The liquid circulated by the external pump is guided into the liquid storing container from the first liquid inflow passage of the plug via the second liquid inflow passage of the socket. An outside air to be replaced by an amount corresponding to the decreased amount of liquid stored in the liquid storing container is guided to the inside space of the liquid storing container from the outside space thereof via the second gas passage of the socket and the first gas passage of the plug.

Thus, the connector according to the first aspect of the present disclosure has a structure capable of causing the liquid stored in the liquid storing container to flow to the outside, causing the liquid that has flown to the outside and circulated to flow into the liquid storing container, and introducing an outside air corresponding to the decreased amount of liquid stored in the liquid storing container.

The structure for switching the liquid circulation state by bringing the valve body, which is disposed at the socket, and the valve seat, which is disposed at the plug, into contact with each other or separating them from each other, has a section where the passage sectional area decreases locally and includes an urging mechanism for urging the valve body into the closed state. Accordingly, when the liquid is a slurry containing a polishing agent or the like (a slurry in which solid particles are dispersed), the solid particles adhere to the section where the passage sectional area decreases locally, which deteriorates the liquidity of the liquid. Further, when the solid particles adhere to the urging mechanism of the valve body and are coagulated, the valve body cannot be opened or closed smoothly.

On the other hand, in the connector according to one aspect of the present disclosure, the switching mechanism switches the rotary valve to the open state or the closed state, thereby making it possible to switch between the open state and the closed state. The open state is a state in which the liquid circulates in the second liquid outflow passage and the second liquid inflow passage via the outflow through-hole and the inflow through-hole. The closed state is a state in which the liquid does not circulate in the second liquid outflow passage and the second liquid inflow passage via the outflow through-hole and the inflow through-hole.

Thus, it is possible to prevent defects, such as the accumulation of solid particles at the section where the passage sectional area decreases locally, the deterioration in the liquidity of the liquid, and such a defect that solid particles adhere to the urging mechanism of the valve body, which makes it difficult to smoothly open and close the valve.

Further, since the rotary valve is switched to the closed state by the switching mechanism, the liquid remaining in the socket can be prevented from flowing to the outside when the socket is detached from the plug.

In the connector according to one aspect of the present disclosure, the rotary valve may have a first discharge hole and a second discharge hole, the first discharge hole having one end opened to an outer peripheral surface of the rotary valve and the other end opened to the outflow through-hole, the second discharge hole having one end opened to the outer peripheral surface of the rotary valve and the other end opened to the inflow through-hole. When the switching mechanism switches the rotary valve to the closed state, the first discharge hole may communicate with the second liquid outflow passage below the outflow through-hole, and the second discharge hole may communicate with the second liquid inflow passage below the inflow through-hole.

According to the connector having the structure as described above, when the switching mechanism switches the rotary valve to the closed state, the liquid remaining in the outflow through-hole is guided to the second liquid outflow passage via the first discharge hole, and is further guided to the liquid storing container via the plug. Further, the liquid remaining in the inflow through-hole is guided to the second liquid inflow passage via the second discharge hole, and is further guided to the liquid storing container via the plug. Accordingly, even when the liquid stored in the liquid storing container is a slurry containing solid particles, such a defect that the solid particles remain in the outflow through-hole and the inflow through-hole and are coagulated can be prevented.

In the connector having the structure as described above, the socket body may have a communication hole for allowing the outflow through-hole and the inflow through-hole to communicate with each other when the switching mechanism switches the rotary valve to the closed state.

With this structure, the liquid passage is formed to allow the second liquid outflow passage, the outflow through-hole, the communication hole, the inflow through-hole, and the second liquid inflow passage to communicate with each other in this order after the socket is detached from the plug. The solid particles or the like remaining in the socket can be cleaned by circulating a liquid for cleaning, such as purified water, in the liquid passage.

A socket according to one aspect of the present disclosure is attached to a liquid storing container having an opening formed in an upper surface thereof, the opening being formed with a cylindrical shape about a first axial line, the socket including: a socket body including, formed therein, a liquid outflow passage that causes a liquid drawn out from a plug fixed to the opening to flow to an outside; a liquid inflow passage that guides the liquid flowing in from the outside of the liquid storing container to the plug; and a gas passage that circulates an outside air between an inside space of the liquid storing container and an outside space of the liquid storing container, the socket body having a columnar insert hole formed along a second axial line so as to penetrate through the liquid outflow passage and the liquid inflow passage, the second axial line intersecting with the first axial line; a columnar rotary valve having an outflow through-hole and an inflow through-hole and inserted into the insert hole, the outflow through-hole being formed at a location where the second liquid outflow passage is disposed on the second axial line, the inflow through-hole being formed at a location where the second liquid inflow passage is disposed on the second axial line; and a switching mechanism that rotates the rotary valve about the second axial line and switches between an open state and a closed state, the open state being a state in which the outflow through-hole and the liquid outflow passage communicate with each other and the inflow through-hole and the liquid inflow passage communicate with each other, the closed state being a state in which the outflow through-hole and the liquid outflow passage do not communicate with each other and the inflow through-hole and the second liquid inflow passage do not communicate with each other.

In the socket according to one aspect of the present disclosure, the liquid is sucked by an external pump in the state where the socket is attached to the plug, and the liquid drawn out from the plug flows to the outside via the liquid circulation passage. Further, the liquid circulated by the external pump is guided into the liquid storing container from the plug via the liquid inflow passage. Furthermore, an outside air to be replaced by an amount corresponding to the decreased amount of liquid stored in the liquid storing container is guided to the inside space of the liquid storing container from the outside space via the gas passage and the plug.

Thus, the socket according to one aspect of the present disclosure has a structure capable of causing the liquid stored in the liquid storing container to flow to the outside, causing the liquid that has flown to the outside and circulated to flow into the liquid storing container, and introducing the outside air corresponding to the decreased amount of liquid stored in the liquid storing container.

The structure for switching the liquid circulation state by bringing the valve body, which is disposed at the socket, and the valve seat, which is disposed at the plug, into contact with each other or separating them from each other, has a section where the passage sectional area decreases locally and includes an urging mechanism for urging the valve body into the closed state. Accordingly, when the liquid is a slurry containing a polishing agent or the like (a slurry in which solid particles are dispersed), the solid particles adhere to the section where the passage sectional area decreases locally, which deteriorates the liquidity of the liquid. Further, when the solid particles adhere to the urging mechanism of the valve body and are coagulated, the value body cannot be opened or closed smoothly.

On the other hand, in the socket according to one aspect of the present disclosure, the switching mechanism switches the rotary valve to the open state or the closed state, thereby making it possible to switch between the open state and the closed state. The open state is a state in which the liquid circulates in the second liquid outflow passage and the second liquid inflow passage via the outflow through-hole and the inflow through-hole. The closed state is a state in which the liquid does not circulate in the second liquid outflow passage and the second liquid inflow passage via the outflow through-hole and the inflow through-hole.

This structure prevents such a defect that the solid particles accumulate at the section where the passage sectional area decreases locally, which deteriorates the liquidity of the liquid. Further, since the switching mechanism switches the second liquid inflow passage to the closed state, the liquid remaining in the liquid return passage can be prevented from flowing to the outside when the socket is detached from the plug.

Advantageous Effects

According to the present disclosure, it is possible to provide a socket that prevents deterioration in the liquidity of a liquid stored in a liquid storing container even when the liquid is a slurry containing solid particles, and also prevents the liquid from flowing to the outside when the socket is detached from a plug, and a connector including the socket.

DESCRIPTION OF EMBODIMENTS

A liquid supply system according to an embodiment of the present disclosure will be described below with reference to the drawings.

Figure 1:
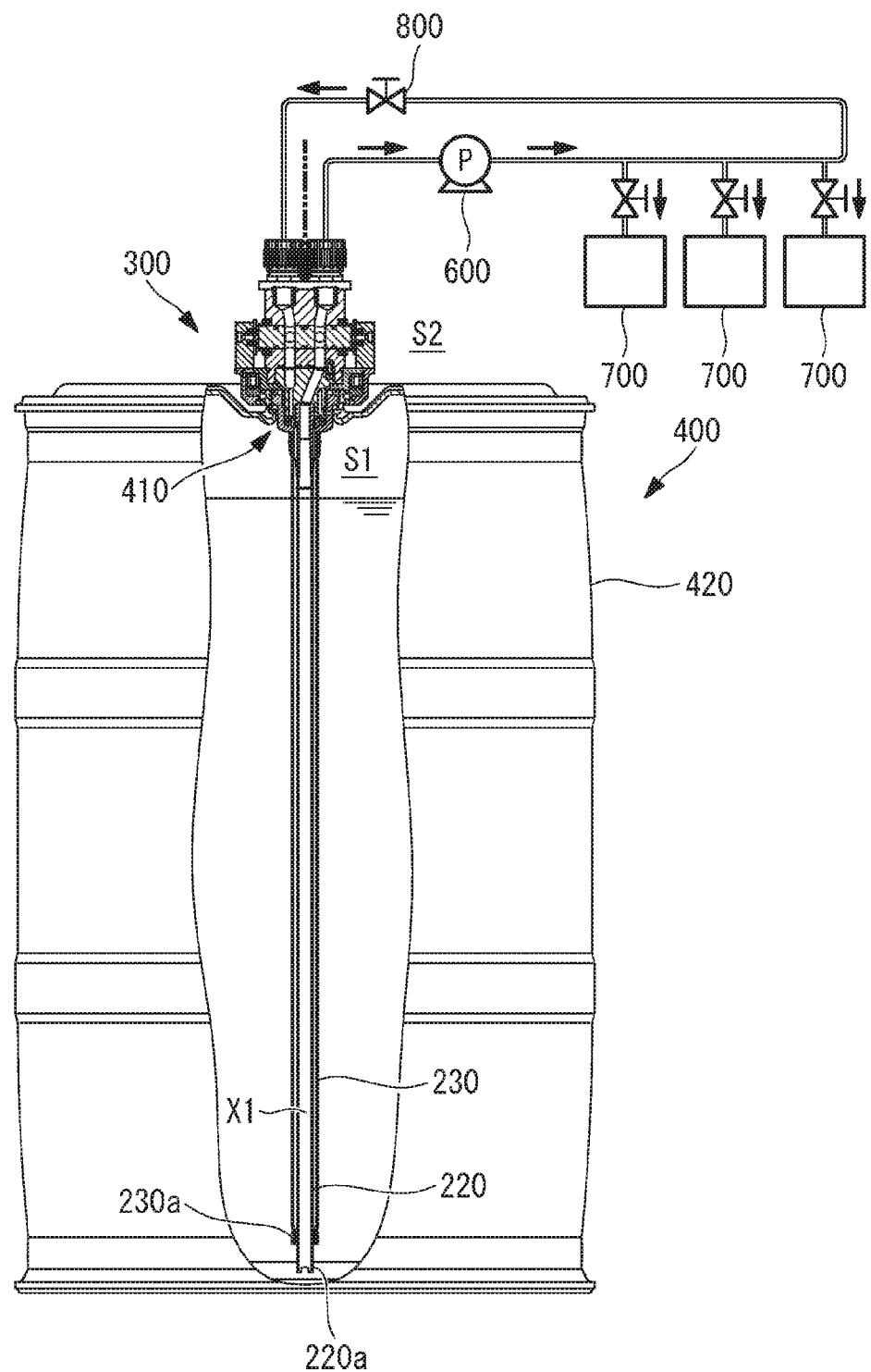
FIG. 1 is a structural diagram showing a liquid supply system according to an embodiment of the present disclosure.

The liquid supply system according to this embodiment shown in FIG. 1 is a system in which a liquid stored in a liquid storing container 400 is sucked by a pump 600 and the sucked liquid is supplied to a plurality of supply destination devices 700.

The amount of liquid to be supplied to each supply destination device 700 is adjusted by a flow rate regulating valve which is provided at the supply destination device 700. In the liquid sucked by the pump 600, the remaining liquid which has not been supplied to each supply destination device 700 is returned to the liquid storing container 400 again via a circulation amount regulating valve 800.

In this manner, the liquid supply system according to this embodiment supplies part of the liquid drawn out from the liquid storing container 400 to each supply destination device 700, and causes the remaining liquid to return to the liquid storing container 400 again for circulation. This structure is intended to prevent solid particles from settling at the bottom of the liquid storing container 400, because the liquid stored in the liquid storing container 400 is a slurry in which solid particles are dispersed.

Note that the flow rate of the liquid to be circulated by the liquid supply system is adjusted by the aperture of the circulation amount regulating valve 800.

The slurry used as the liquid in this embodiment is, for example, a liquid containing a silica-based or ceria-based polishing agent used for chemical mechanical polishing which is a wafer polishing method to be employed during semiconductor production.

As shown in FIG. 1, the liquid storing container 400 included in the liquid supply system according to this embodiment includes a container body 420 that stores the liquid, and an opening 410 that is disposed at the upper surface of the container body 420 and is formed with a cylindrical shape about an axial line X1 (first axial line).

As shown in FIG. 1, the liquid supply system according to this embodiment includes a connector 300 to be attached to the opening 410 of the liquid storing container 400. The connector 300 is a device including: a liquid outflow passage that draws out the liquid stored in the liquid storing container 400 and supplying the liquid to the pump 600; a liquid inflow passage that allows the liquid, which has passed through the circulation amount regulating valve 800, to be returned to the liquid storing container 400; and a gas passage that introduces an outside air corresponding to the decreased amount of liquid from the liquid storing container 400. According to the connector 300 of this embodiment, the outflow of the liquid, the inflow of the liquid, and the replacement of the outside air corresponding to the decreased amount of liquid can be achieved by one device which is attached to the opening 410 at one section.

The connector 300 according to this embodiment will be described below with reference to the drawings.

Figure 2:
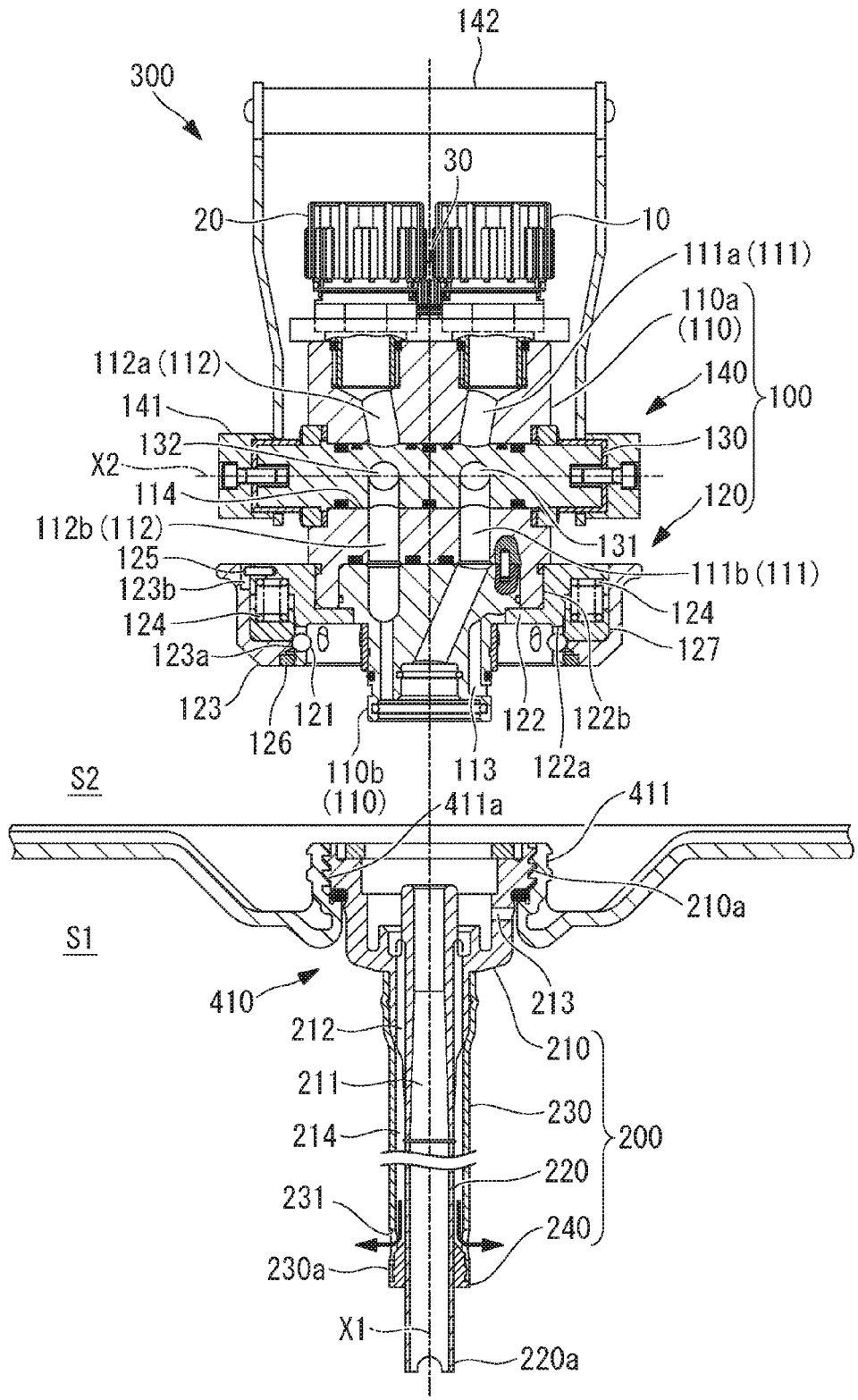
FIG. 2 is a partial longitudinal sectional view of a connector in a state where a socket is spaced apart from a plug as viewed from the front side.
Figure 3:
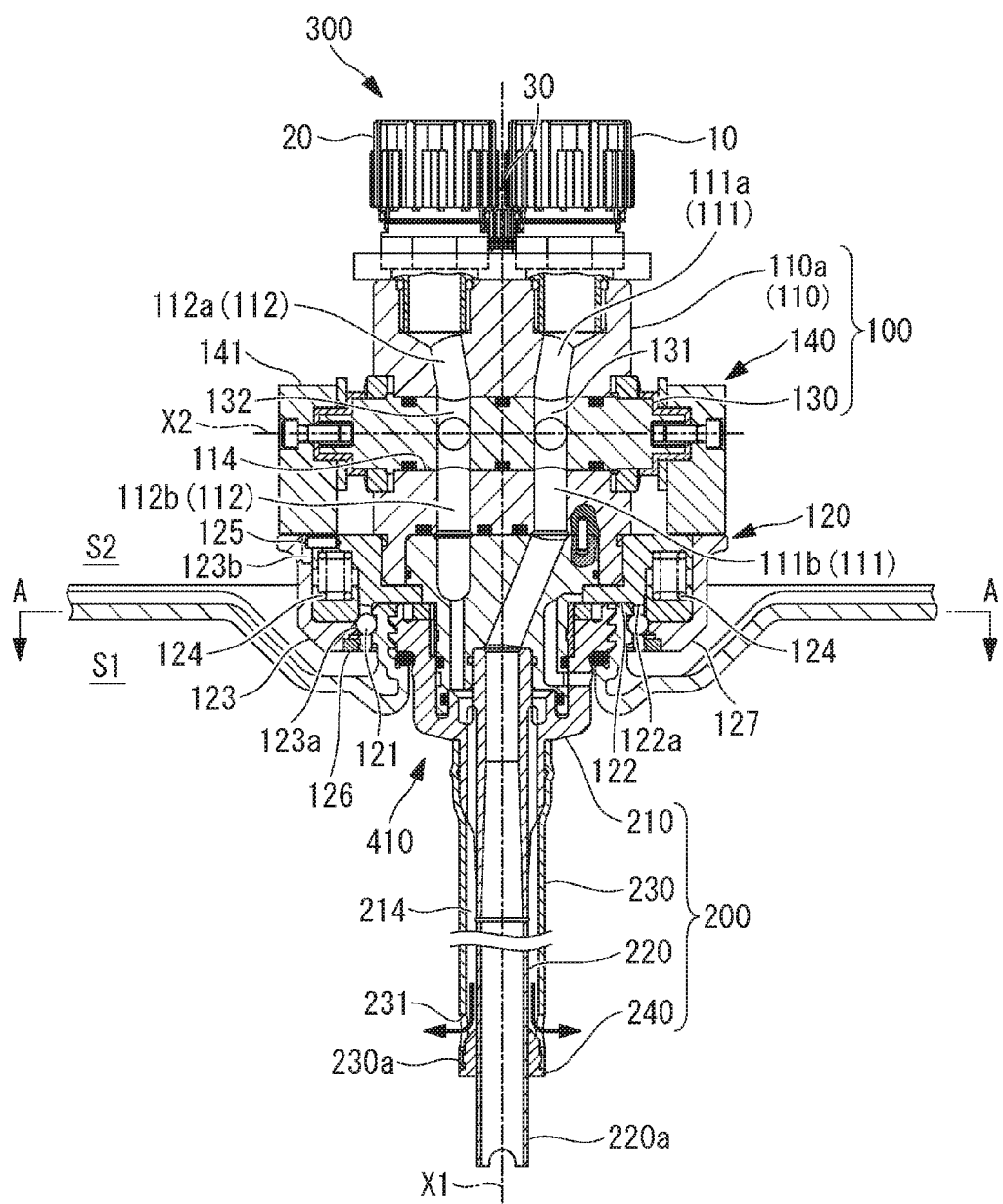
FIG. 3 is a partial longitudinal sectional view of the connector in a state where the socket is attached to the plug as viewed from the front side.

As shown in FIGS. 2 and 3, the connector 300 according to this embodiment includes a plug 200 and a socket 100. The plug 200 is fixed to a female screw 411a that is formed in the inner peripheral surface of the opening 410 formed in the upper surface of the liquid storing container 400. The socket 100 is detachably attached to the plug 200.

FIG. 2 shows a state where the socket 100 is spaced apart from the plug 200, and FIG. 3 shows a state where the socket 100 is attached to the plug 200.

The plug 200 included in the connector 300 according to this embodiment will be described.

As shown in FIG. 2, the plug 200 includes: a plug body 210; an inside pipe 220 which is attached to a lower portion of the plug body 210 and is formed with a cylindrical shape about the axial line X1; an outside pipe 230 which is attached to the plug body 210 and has a cylindrical shape; and a sealing member 240 for sealing the space between the outside pipe 230 and the inside pipe 220.

Each member constituting the plug 200 is formed of a fluorine-contained resin material, such as PFA (tetrafluoroethylene perfluoroalkylvinylether copolymer), or a crystalline thermoplastic resin such as HDPE (high-density polyethylene).

The plug body 210 is a member that is formed with a substantially cylindrical shape about the axial line X1 and has a male screw 210a that is formed on the outer peripheral surface at an upper end thereof. The male screw 210a of the plug body 210 is fastened to the female screw 411a, which is formed in the inner peripheral surface of the opening 410, thereby fixing the plug body 210 to the inner peripheral surface of the opening 410.

In the plug body 210, a first liquid outflow passage 211, a first liquid inflow passage 212, and a first gas passage 213 are formed.

The first liquid outflow passage 211 is a guide passage that draws out the liquid stored in the liquid storing container 400 and guides the liquid to the discharge port 10. The first liquid inflow passage 212 is a passage that guides the liquid flowing in from the outside of the liquid storing container 400 via the inflow port 20 into the liquid storing container 400. The first gas passage 213 is a passage that circulates an outside air between an inside space S1 of the liquid storing container 400 and an outside space S2 of the liquid storing container 400.

The inside pipe 220 is a member that is formed with a cylindrical shape along the axial line X1. As shown in FIG. 1, in the state where the plug 200 is attached to the opening 410 of the liquid storing container 400, a lower end (first lower end) 220a of the inside pipe 220 is disposed in the vicinity of the bottom of the liquid storing container 400.

The inside pipe 220 is attached to a lower end of the plug body 210 by heat welding and guides the liquid stored in the liquid storing container 400 to the first liquid outflow passage 211 of the plug body 210.

The outside pipe 230 is a member that is formed with a cylindrical shape along the axial line X1. As shown in FIGS. 1 and 2, in the state where the plug 200 is attached to the opening 410 of the liquid storing container 400, a lower end (second lower end) 230a of the outside pipe 230 is disposed above the lower end 220a of the inside pipe 220.

The outside pipe 230 is attached to the outer peripheral surface below the plug body 210 by press fitting and is disposed on the outside of the inside pipe 220. Between the outer peripheral surface of the inside pipe 220 and the inner peripheral surface of the outside pipe 230, a circular passage 214 for guiding the liquid, which has been guided to the first liquid inflow passage 212 of the plug body 210, into the liquid storing container 400 is formed.

At the lower end 230a of the outside pipe 230, a plurality of outflow holes 231 through which the liquid is caused to flow out of the circular passage 214 into the liquid storing container 400 are formed at a plurality of sections (for example, four sections at an interval of 90°) about the axial line X1.

The sealing member 240 is a member for sealing the space between the outer peripheral surface of the inside pipe 220 and the inner peripheral surface of the lower end 230a of the outside pipe 230. The sealing member 240 prevents the liquid flowing from the circular passage 214 from being directly guided to the bottom surface of the liquid storing container 400 along the axial line X1. Since the lower end of the circular passage 214 is sealed by the sealing member 240, the liquid which has reached the lower end of the circular passage 214 flows out into the liquid storing container 400 through the outflow hole 231 as indicated by arrows shown in FIG. 2.

The liquid falling from the upper position to the lower position along the circular passage 214 flows out horizontally (in a direction perpendicular to the axial line X1) from the plurality of outflow holes 231. Accordingly, the liquid flows out in a plurality of directions in which the plurality of outflow holes 231 are opened, so that the liquid in the vicinity of the bottom surface of the liquid storing container 400 flows favorably. Accordingly, when the liquid is a slurry containing a polishing agent or the like (a slurry in which solid particles are dispersed), the state in which the solid particles and the liquid are favorably mixed in the vicinity of the bottom surface of the liquid storing container 400 is maintained.

In the above description, the plurality of outflow holes 231 are formed at the lower end 230a of the outside pipe 230. Alternatively, a single outflow hole 231 may be formed at the lower end 230a of the outside pipe 230.

The socket 100 included in the connector 300 according to this embodiment will be described below.

As shown in FIG. 2, the socket 100 includes a socket body 110, a lock ball mechanism 120, which is attached to the socket body 110, a columnar rotary valve 130, which is inserted into a columnar insert hole 114 formed in the socket body 110, and a switching mechanism 140 that rotates the rotary valve 130 about an axial line X2 (second axial line).

Figure 10:
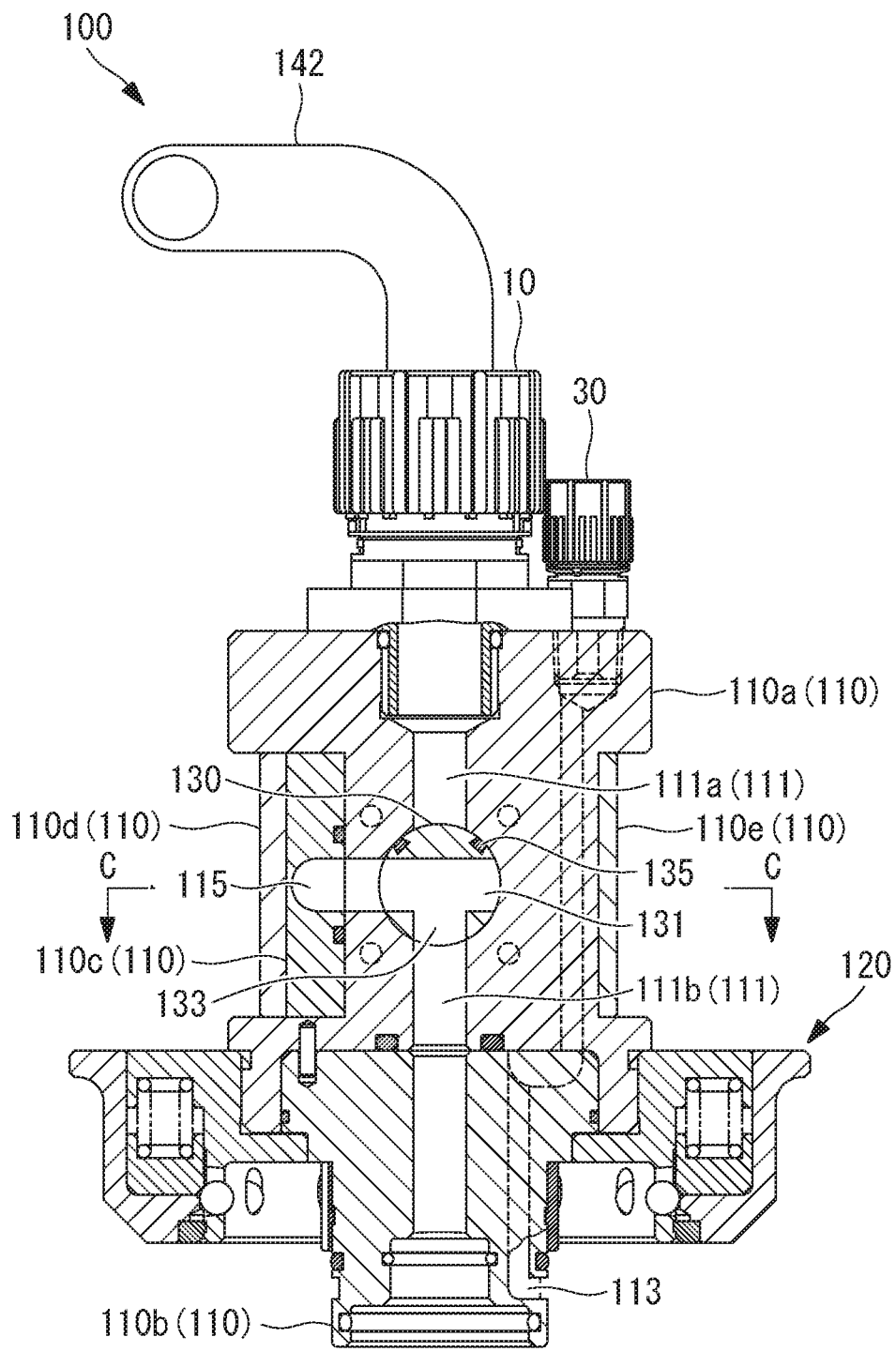
FIG. 10 is a partial sectional view of the socket as viewed along a line B-B shown in FIG. 9.
Figure 11:
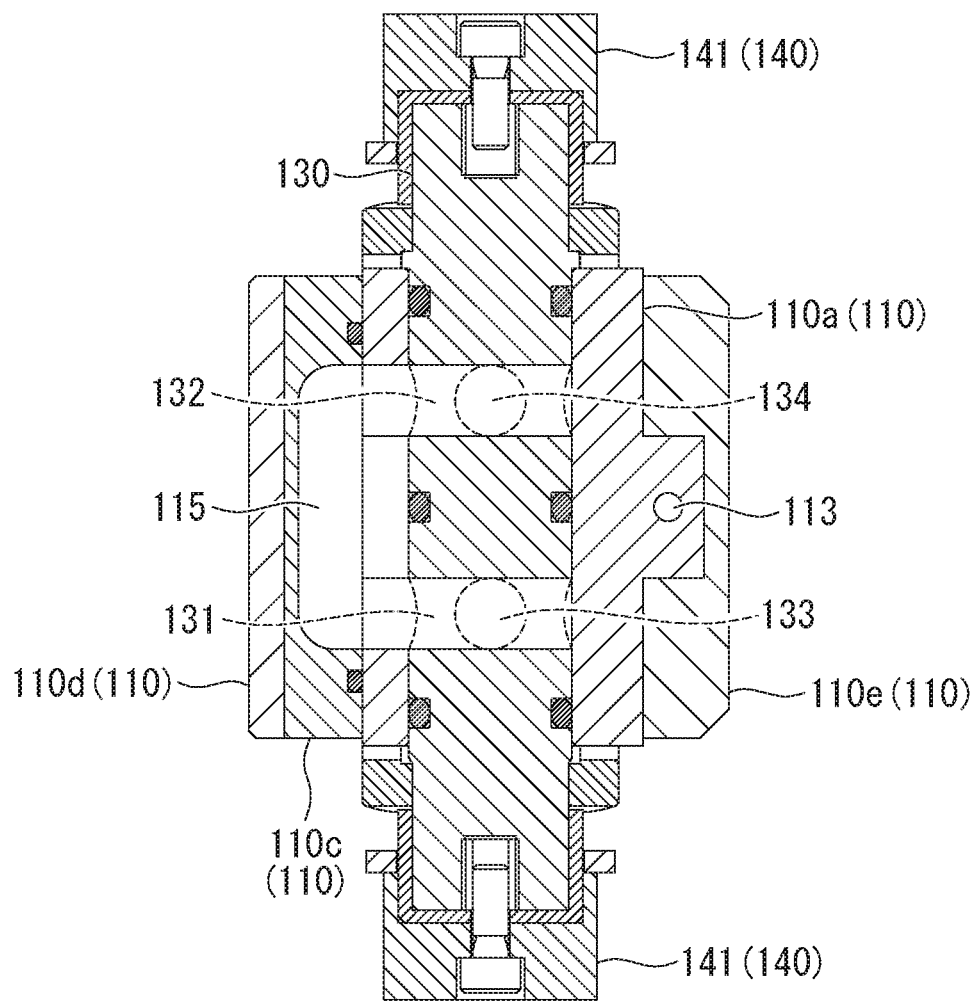
FIG. 11 is a partial sectional view of the socket as viewed along a line C-C shown in FIG. 10.

The socket body 110 is a member that is formed with a substantially cylindrical shape about the axial line X1. The socket body 110 includes, at an upper end thereof, a first body portion 110a to which the discharge port 10 and the inflow port 20 are attached, and also includes, at a lower end thereof, a second body portion 110b into which the plug 200 is inserted. Further, as shown in FIGS. 10 and 11 to be described later, the socket body 110 includes a communication member 110c, a plate-like member 110d, and a plate-like member 110e.

The second body portion 110b is fixed by the socket member 122 of the lock ball mechanism 120, which is described later, in the state where the second body portion 110b is inserted into the lower end of the first body portion 110a.

In the socket body 110, a second liquid outflow passage 111, a second liquid inflow passage 112, and a second gas passage 113 are formed.

The second liquid outflow passage 111 is a passage that causes the liquid to be drawn out from the first liquid outflow passage 211 via the discharge port 10 to the outside. The second liquid inflow passage 112 is a passage that guides the liquid flowing in from the outside of the liquid storing container 400 via the inflow port 20 to the first liquid inflow passage 212. The second gas passage 113 is a passage that is connected to the first gas passage 213 and allows an outside air to circulate between the inside space S1 of the liquid storing container 400 and the outside space S2 of the liquid storing container 400 via a vent port 30.

The lock ball mechanism 120 is a mechanism for allowing a plurality of lock balls 121 to be engaged with engagement grooves 411, which are formed along the circumferential direction about the axial line X1 in the outer peripheral surface of the opening 410 of the liquid storing container 400, and then fixing the plurality of lock balls 121 to the engagement grooves 411. The socket body 110 is fixed to the opening 410 of the liquid storing container 400 by the lock ball mechanism 120 in a state where the socket 100 and the plug 200 are attached.

As shown in FIG. 2, the lock ball mechanism 120 includes a plurality of lock balls 121, a socket member (first cylindrical member) 122, a sleeve (second cylindrical member) 123, a spring (urging force generation unit) 124, a rotation regulating pin (rotation regulating mechanism) 125, a stop ring 126, and a spring receiving member 127.

The socket member 122 is a member that is formed with a cylindrical shape about the axial line X1 and has a plurality of opening holes 122a having a diameter smaller than the outer diameter of the spherical lock balls 121. As shown in FIGS. 2 and 3, the plurality of lock balls 121 are respectively stored in the plurality of opening holes 122a of the socket member 122. However, the outer diameter of each lock ball 121 is larger than the diameter of the opening hole 122a, which prevents the lock balls 121 from being completely removed from the opening hole 122a to the inner peripheral side of the socket member 122.

The socket member 122 is fixed to the socket body 110 in such a manner that the female screw 122b formed in the inner peripheral surface is fastened to the male screw formed on the outer peripheral surface of the first body portion 110a of the socket body 110.

The sleeve 123 is a member that is formed with a cylindrical shape about the axial line X1 and is disposed on the outer peripheral side of the socket member 122. The upper end position of the sleeve 123 is regulated by the socket member 122, and the lower end position of the sleeve 123 is regulated by the circular stop ring 126 which is attached to the outer peripheral surface on the lower end side of the socket member 122. The sleeve 123 is movable relative to the socket member 122 between the lower end position and the upper end position of the socket member along the axial line X1.

The sleeve 123 has a regulating portion 123a that regulates the plurality of lock balls 121 accommodated in the opening holes 122a to be engaged with the engagement grooves 411 of the opening 410.

The spring 124 is an elastic member having an upper end (one end) that is formed along the axial line X1 and fixed to the socket member 122, and having a lower end (the other end) that is formed along the axial line X1 and fixed to the sleeve 123 via the spring receiving member 127. The spring 124 generates an urging force by elastic deformation, and urges the sleeve 123 against the lower end position where the regulating portion 123a of the sleeve 123 contacts the lock balls 121. The springs 124 are arranged at a plurality of sections at regular intervals in the circumferential direction (for example, six sections at an interval of 60°) about the axial line X1. The arrangement of the springs 124 at the plurality of sections at regular intervals makes it possible to supply the sleeve 123 to be supplied with a uniform urging force.

In this case, the spring receiving member 127 is a member that is formed with a circular shape about the axial line X1, and has opening holes for storing the springs 124 that are formed at a plurality of sections.

While the springs 124 are provided at the plurality of sections at regular intervals in the circumferential direction about the axial line X1 in this embodiment. Alternatively, a single spring having the same diameter as that of the spring receiving member 127 may be provided about the axial line X1.

The rotation regulating pin 125 is a member that regulates the rotation of the sleeve 123 about the axial line X1 with respect to the socket member 122. The rotation regulating pin 125 has one end fixed to the outer peripheral surface of the socket member 122, and the other end inserted into a rotation regulating groove (rotation regulating mechanism) 123b that is formed along the axial line X1 in the inner peripheral surface of the sleeve 123. The rotation regulating mechanism composed of the rotation regulating pin 125 and the rotation regulating groove 123b regulates the rotation of the sleeve 123 about the axial line X1 with respect to the socket member 122, and allows the sleeve 123 to move along the axial line X1 with respect to the socket member 122.

An operation for fixing the socket 100 to the opening 410 of the liquid storing container 400 by using the lock ball mechanism 120 will now be described.

Figure 4:
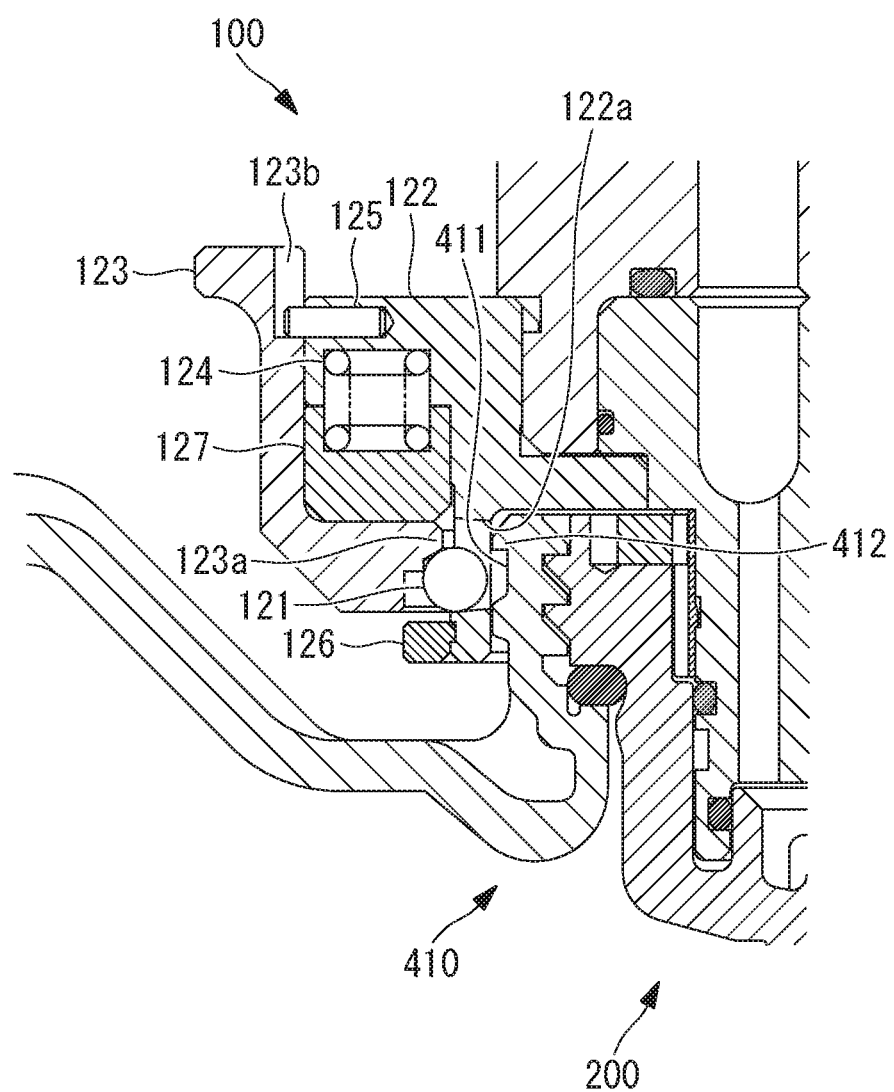
FIG. 4 is a partial longitudinal sectional view of a lock ball mechanism in a state where a lock ball is not engaged with an engagement groove.

As shown in FIG. 4, when the socket 100 is attached to the opening 410 of the liquid storing container 400, an operator causes the sleeve 123 disposed outside to be pulled upward along the axial line X1 and withdrawn so as to prevent the regulating portion 123a of the sleeve 123 from contacting the lock balls 121. In this case, the lock balls 121 are arranged at the location indicated by a solid line so as not to project from the opening hole 122a. The operator inserts the socket 100 into the plug 200 and the opening 410 in the state where the sleeve 123 is pulled upward along the axial line X1, so that the state shown in FIG. 4 is obtained.

As shown in FIG. 4, a leading end 412 of the opening 410 has a tapered shape in which the outer diameter of the opening increases at a constant gradient about the axial line X1 in a direction from the upper position to the lower position. Accordingly, even when the lock balls 121 project inward from the opening hole 122a when the socket 100 is attached to the opening 410, the lock balls 121 are guided to the outside along the leading end 412 of the opening 410 that has a tapered shape. Thus, a defect in the attachment of the socket 100 to the opening 410 due to the contact between the lock balls 121 and the leading end 412 of the opening 410 is prevented from occurring.

The operator inserts the socket 100 into the plug 200 and removes his/her hand from the sleeve 123 after the state shown in FIG. 4 is obtained, to allow the lock balls 121 to be engaged with the engagement grooves 411 of the opening 410, so that the socket 100 can be fixed to the outer peripheral surface of the opening 410. This is because when the operator removes his/her hand from the sleeve 123, the spring 124 supplies the sleeve 123 with a downward urging force, which allows the sleeve 123 to move to the lower end position where the sleeve is switched to contact with the stop ring 126.

Figure 5:
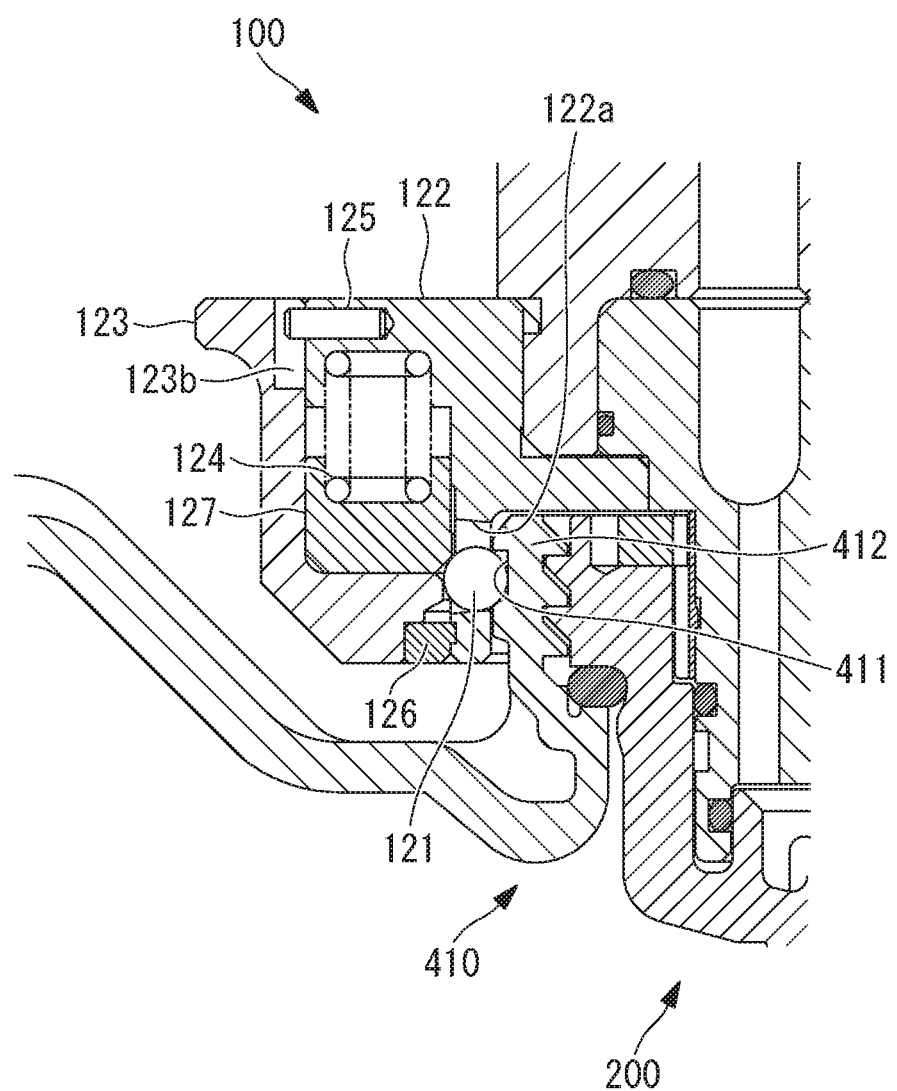
FIG. 5 is a partial longitudinal sectional view of the lock ball mechanism in a state where the lock ball is engaged with the engagement groove.

As shown in FIG. 5, when the sleeve 123 moves to the lower end position, the regulating portion 123a moves to the location in contact with the lock balls 121, so that the plurality of lock balls 121 are fixed to the engagement grooves 411.

Next, another aspect of the operation for fixing the socket 100 to the opening 410 of the liquid storing container 400 by using the lock ball mechanism 120. In this aspect, the socket 100 is pressed into the plug 200 to attach the socket 100 to the plug 200 at a single touch, without the need for the operator to touch the sleeve 123.

When the socket 100 is attached to the opening 410 of the liquid storing container 400 with the plug 200 fixed to the inner peripheral surface thereof, the operator presses the socket 100 into the plug 200, without touching the sleeve 123, so that the sleeve 123 is pressed upward against the urging force of the spring 124 and the lock balls 121 are withdrawn. Further, the operator presses the socket 100 into the plug 200 until the lock balls 121 reach the position of the engagement grooves 411, so that the lock balls 121 are fixed to the engagement grooves 411 by the urging force of the spring 124. Thus, the operator can allow the socket 100 to be fixed to the outer peripheral surface of the opening 410, without the need for any troublesome work.

Figure 6:
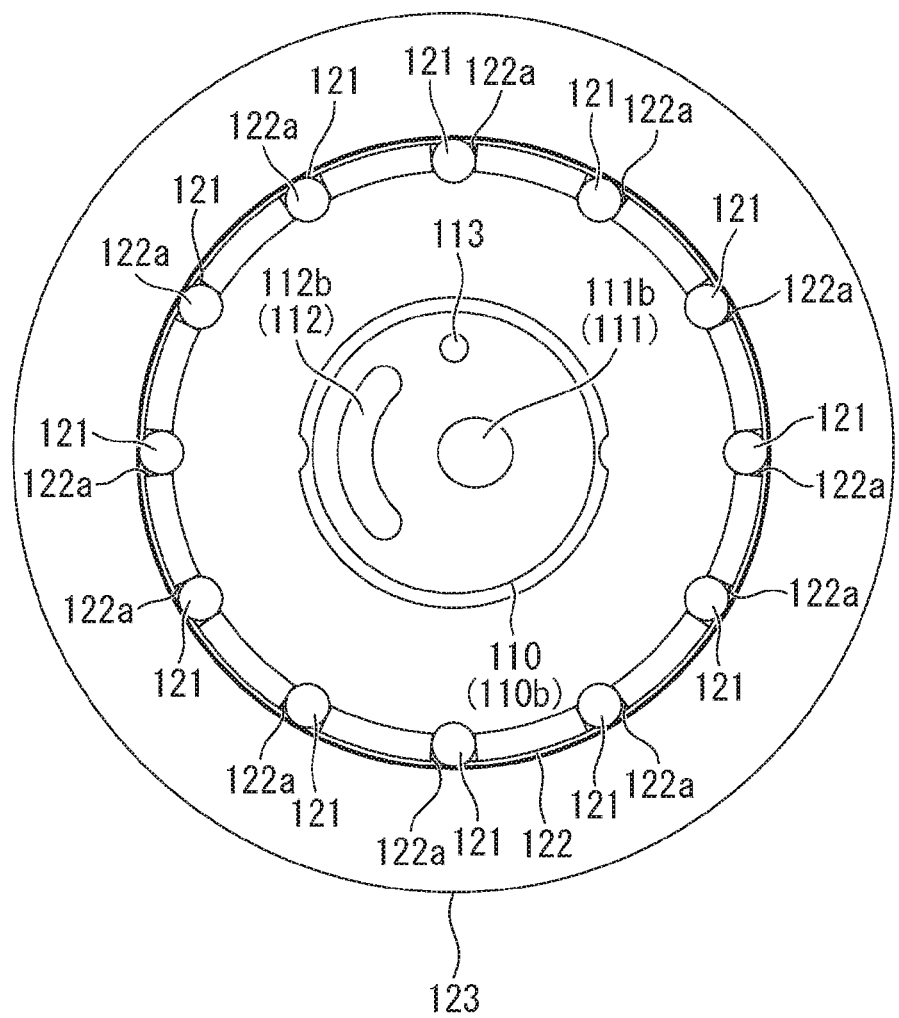
FIG. 6 is a sectional view of the socket as viewed along a line A-A shown in FIG. 3.

As shown in FIG. 6 (a sectional view of the socket as viewed along a line A-A shown in FIG. 3), in the state where the plurality of lock balls 121 are fixed to the engagement grooves 411, the plurality of lock balls 121 project inward from the opening hole 122a. The portions of the plurality of lock balls 121 that project inward from the opening hole 122a correspond to the portions to be engaged with the engagement grooves 411.

The switching mechanism 140 is a mechanism to be connected to the rotary valve 130 to be described later, and rotates the rotary valve about the axial line X2, thereby switching the rotary valve 130 to the open state or the closed state.

The open state of the rotary valve 130 refers to a state in which, as shown in FIG. 3, an outflow through-hole 131, which is formed in the rotary valve 130, and the second liquid outflow passage 111 of the socket body 110 communicate with each other and an inflow through-hole 132, which is formed in the rotary valve 130, and the second liquid inflow passage 112 of the socket body 110 communicate with each other.

The closed state of the rotary valve 130 refers to a state in which, as shown in FIG. 2, the outflow through-hole 131 formed in the rotary valve 130 and the second liquid outflow passage 111 of the socket body 110 do not communicate with each other and the inflow through-hole 132 formed in the rotary valve 130 and the second liquid inflow passage 112 of the socket body 110 do not communicate with each other.

The switching mechanism 140 includes a pair of lock cams (lock members) 141, which are connected to both ends of the rotary valve 130, and an opening/closing arm 142 that connects the pair of lock cams 141 and accepts an opening/closing operation by the operator.

The operator fixes the plug 200 to the inner peripheral surface of the opening 410 to attach the socket 100 to the outer peripheral surface of the opening 410. After that, the operator grips the leading end of the opening/closing arm 142 shown in FIG. 7 and allows the opening/closing arm 142 to rotate clockwise (in a direction indicated by an arrow shown in FIG. 7) about the axial line X2. This allows the rotary valve 130 to be switched from the closed state shown in FIG. 7 to the open state shown in FIG. 8.

Figure 7:
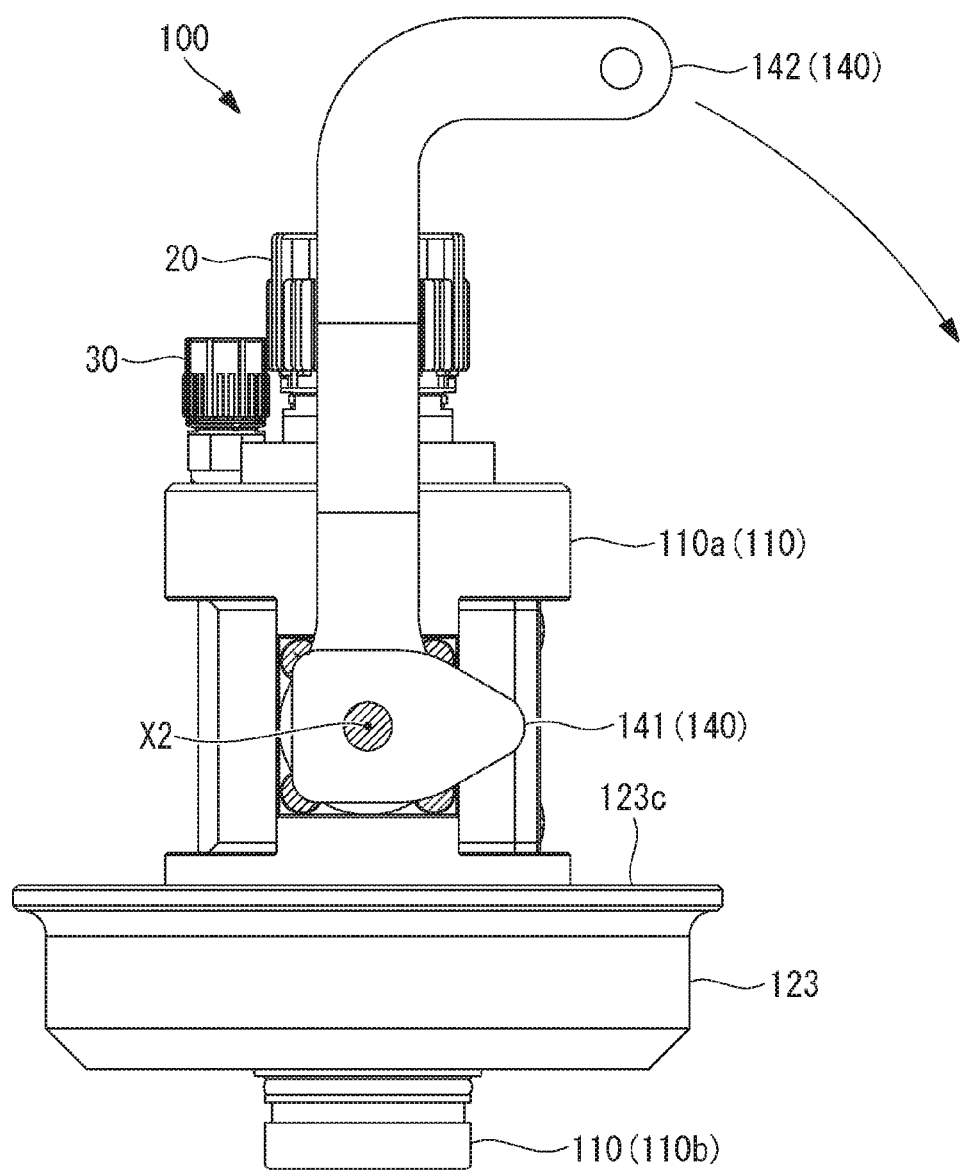
FIG. 7 is a left side view of the socket shown in FIG. 2.
Figure 8:
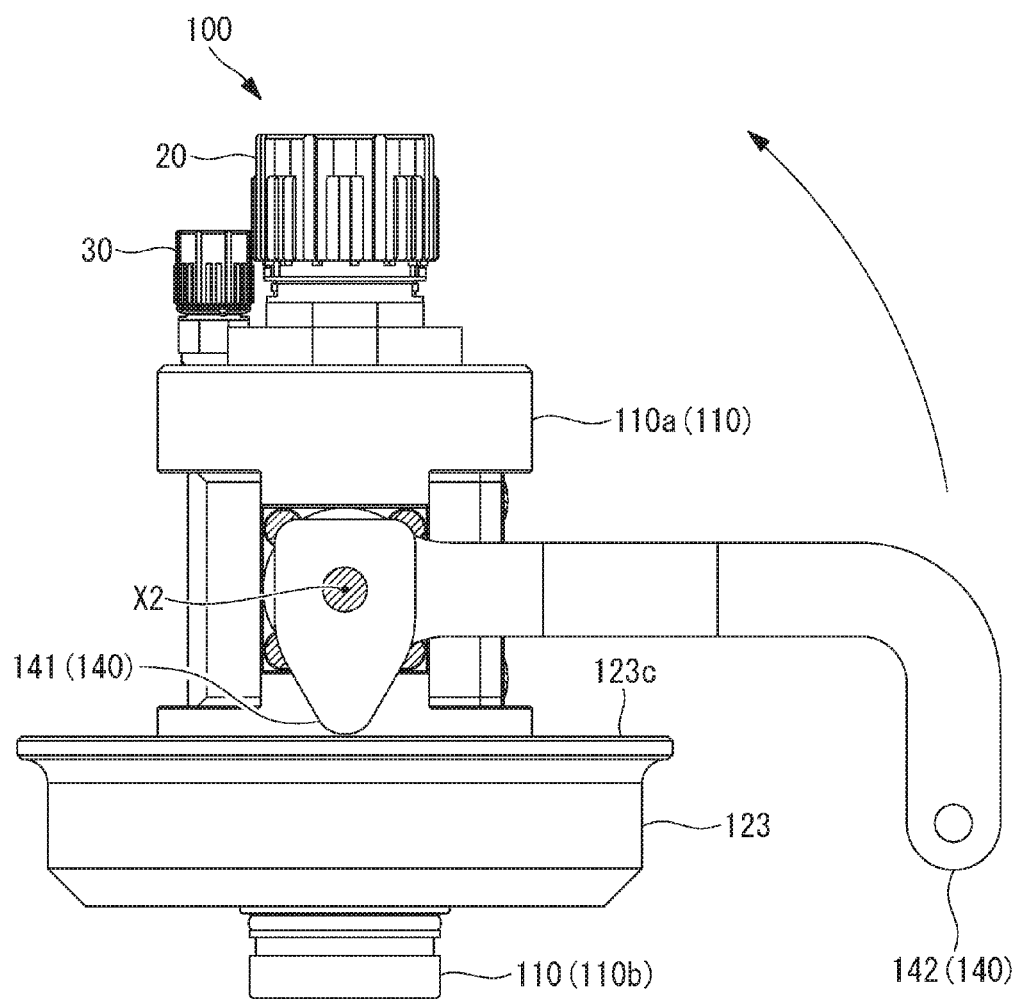
FIG. 8 is a left side view of the socket shown in FIG. 3.

On the other hand, the operator grips the leading end of the opening/closing arm 142 shown in FIG. 8 and allows the opening/closing arm 142 to rotate counterclockwise (in a direction indicated by an arrow shown in FIG. 8) about the axial line X2. This allows the rotary valve 130 to be switched from the open state shown in FIG. 8 to the closed state shown in FIG. 7.

The operator switches the opening/closing arm 142 from the state shown in FIG. 7 to the state shown in FIG. 8, thereby switching the state from a lock release state in which the lock cams 141 are not in contact with an upper surface 123c of the sleeve 123 to a lock state in which the lock cams 141 are in contact with the upper surface 123c of the sleeve 123.

Note that in the lock state, the lock cams 141 need not necessarily be in contact with the upper surface 123c of the sleeve 123. The lock state includes a state in which the lower end of each lock cam 141 is disposed at a location near the upper surface 123c of the sleeve 123 and an upward movement of the sleeve 123 is regulated.

In the lock state, the operator cannot release the state in which the sleeve 123 is pulled upward and the lock ball mechanism 120 is fixed to the opening 410. This is because the upper surface 123c of the sleeve 123 is in contact with the lock cams 141 and the upward movement of the sleeve 123 along the axial line X1 is regulated.

Thus, in the socket 100 according to this embodiment, when the rotary valve 130 is in the open state, the upward movement of the sleeve 123 along the axial line X1 is regulated, thereby making it possible to reliably prevent the outflow of the liquid to the outside due to an incorrect operation or the like.

As shown in FIG. 3, the rotary valve 130 is a member that is formed with a columnar shape along the axial line X2 perpendicular to the axial line X1. The rotary valve 130 includes the outflow through-hole 131, which is formed at the location where the second liquid outflow passage 111 on the axial line X2 is disposed, and the inflow through-hole 132 which is formed at the location where the second liquid inflow passage 112 is disposed on the axial line X2.

The rotary valve 130 is inserted into the insert hole 114, which is formed in the socket body 110, so as to be rotatable about the axial line X2. The insert hole 114 is formed along the axial line X2 so as to penetrate through the second liquid outflow passage 111. The second liquid outflow passage 111 is divided into an upstream-side outflow passage 111b and a downstream-side outflow passage 111a by the insert hole 114. The insert hole 114 is formed along the axial line X2 so as to penetrate through the second liquid inflow passage 112. The second liquid inflow passage 112 is divided into an upstream-side inflow passage 112a and a downstream-side inflow passage 112b by the insert hole 114.

The circulation state of each passage of the socket 100 when the rotary valve 130 is in the closed state will now be described.

Figure 9:
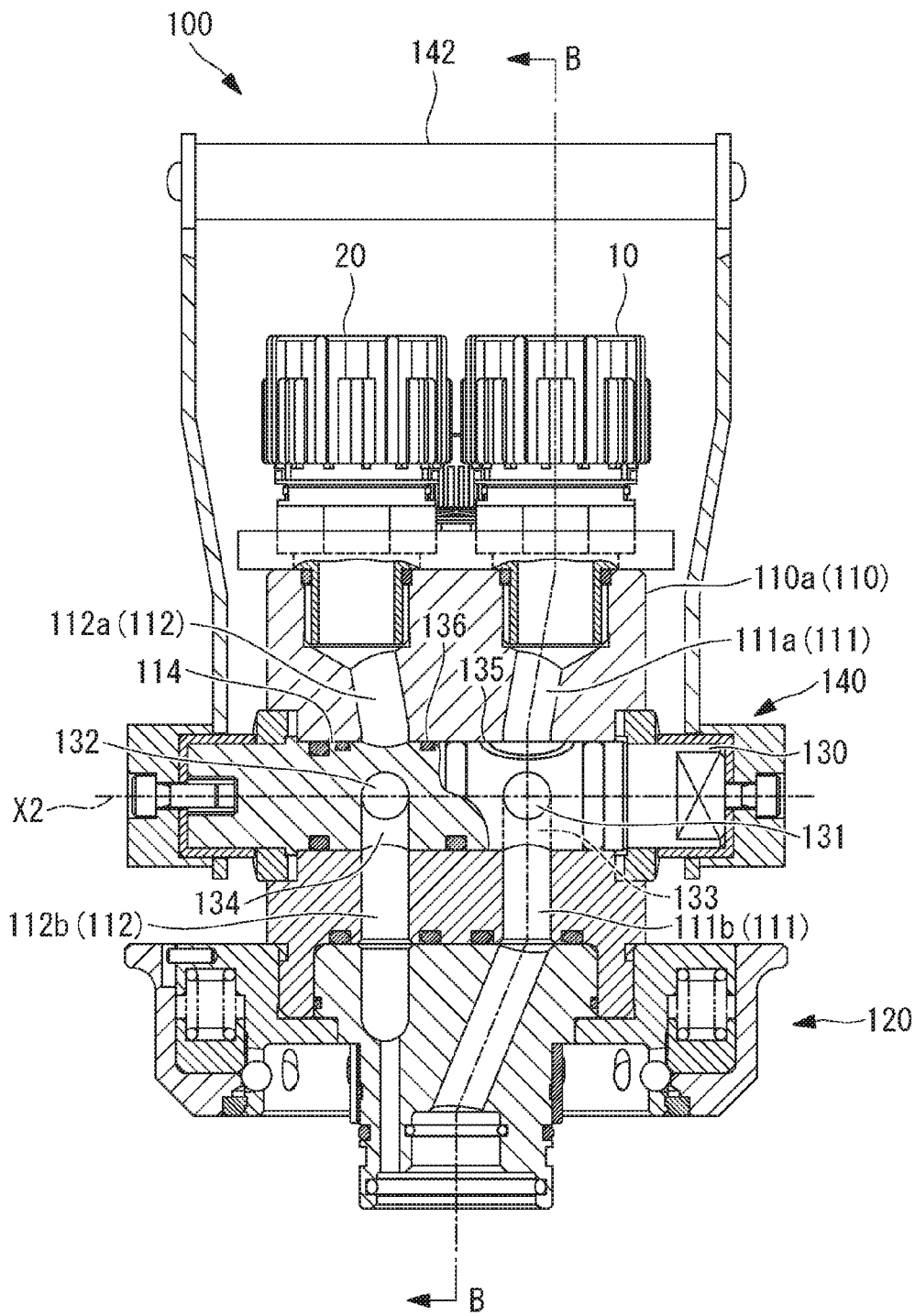
FIG. 9 is a partial longitudinal sectional view of the socket shown in FIG. 2.

As shown in FIGS. 9 and 10, the rotary valve 130 includes: a discharge hole (first discharge hole) 133 having one end opened to the outer peripheral surface of the rotary valve 130 and the other end opened to the outflow through-hole 131, and a discharge hole (second discharge hole) 134 having one end opened to the outer peripheral surface of the rotary valve 130 and the other end opened to the inflow through-hole 132.

The discharge hole 133 is a hole for discharging the liquid remaining in the outflow through-hole 131 to the upstream-side outflow passage 111b when the rotary valve 130 is switched from the open state to the closed state. Similarly, the discharge hole 134 is a hole for discharging the liquid remaining in the inflow through-hole 132 to the downstream-side inflow passage 112b when the rotary valve 130 is switched from the open state to the closed state.

An O-ring 135 shown in FIGS. 9 and 10 is a seal member for sealing the space between the outer peripheral surface of the rotary valve 130 and the inner peripheral surface of the insert hole 114 so as to prevent the liquid from flowing into the space from the downstream-side outflow passage 111a when the rotary valve 130 is in the closed state. The O-ring 135 is press-fit into a circular groove formed in the outer peripheral surface of the rotary valve 130.

Similarly, an O-ring 136 shown in FIG. 9 is a seal member for sealing the space between the outer peripheral surface of the rotary valve 130 and the inner peripheral surface of the insert hole 114 so as to prevent the liquid from flowing into the space from the upstream-side inflow passage 112a when the rotary valve 130 is in the closed state. The O-ring 136 is press-fit into a circular groove formed in the outer peripheral surface of the rotary valve 130.

As shown in FIG. 10, the communication member 110c is attached to the first body portion 110a. Further, the plate-like member 110d and the plate-like member 110e are arranged in such a manner that they sandwich the first body portion 110a and the communication member 110c. In a state where a fixture (not shown) penetrates through the first body portion 110a and the communication member 110c, the plate-like member 110d and the plate-like member 110e are fastened with the fixture, so that the communication member 110c is fixed to the first body portion 110a. The fixture for the plate-like member 110d and the plate-like member 110e is preferably formed of a metallic member such as stainless.

As shown in FIGS. 10 and 11, the communication member 110c has a communication hole 115 formed therein. The communication hole 115 is a hole that allows the outflow through-hole 131 and the inflow through-hole 132 to communicate with each other when the rotary valve 130 is in the closed state. The formation of the communication hole 115 allows the upstream-side outflow passage 111b and the discharge hole 133 to communicate with each other, allows the outflow through-hole 131 and the inflow through-hole 132 to communicate with each other, and allows the discharge hole 134 and the downstream-side inflow passage 112b to communicate with each other, when the rotary valve 130 is in the closed state.

Next, the circulation state of each passage of the socket 100 when the rotary valve 130 is in the open state will be described.

Figure 12:
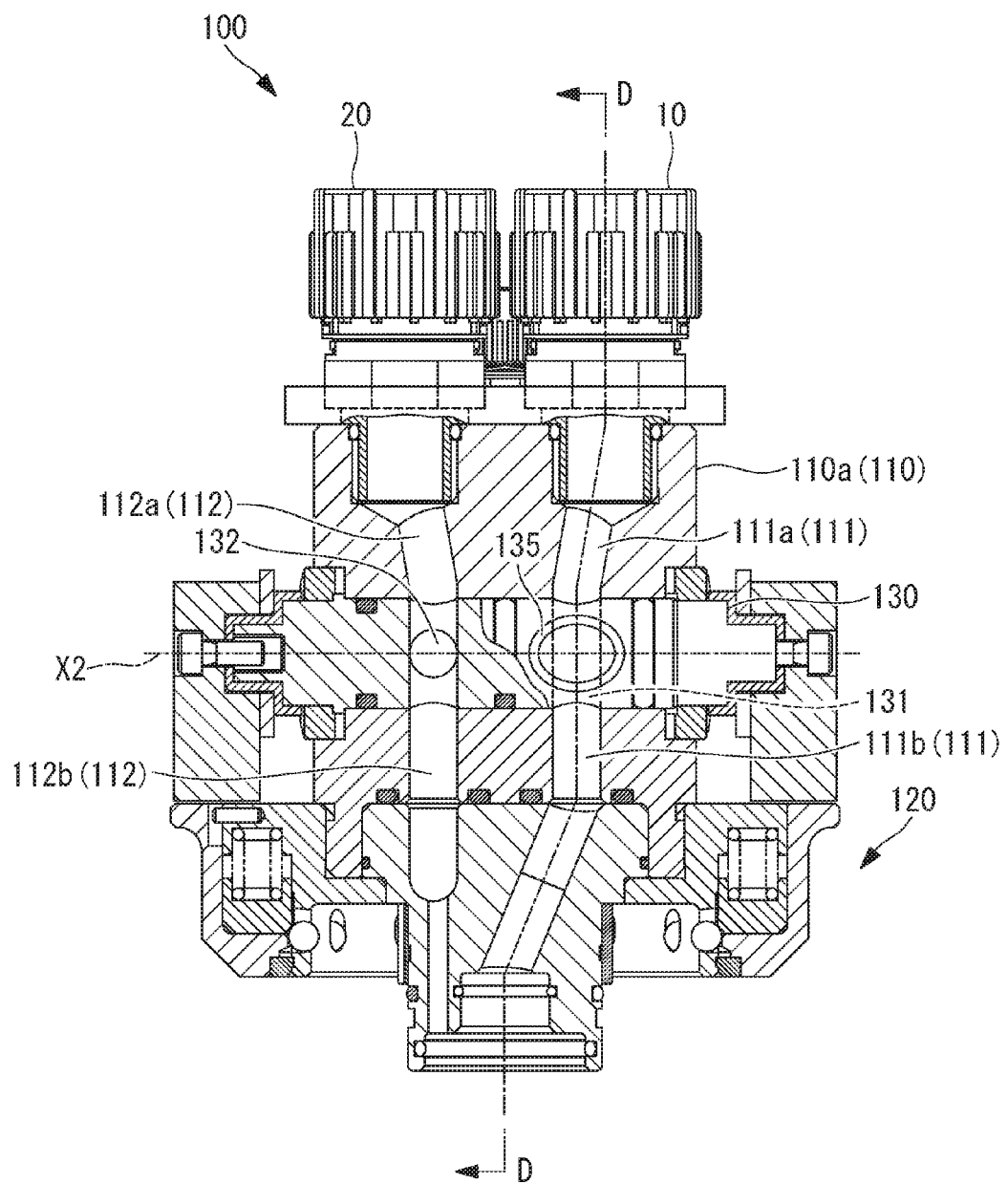
FIG. 12 is a partial longitudinal sectional view of the socket shown in FIG. 3.
Figure 13:
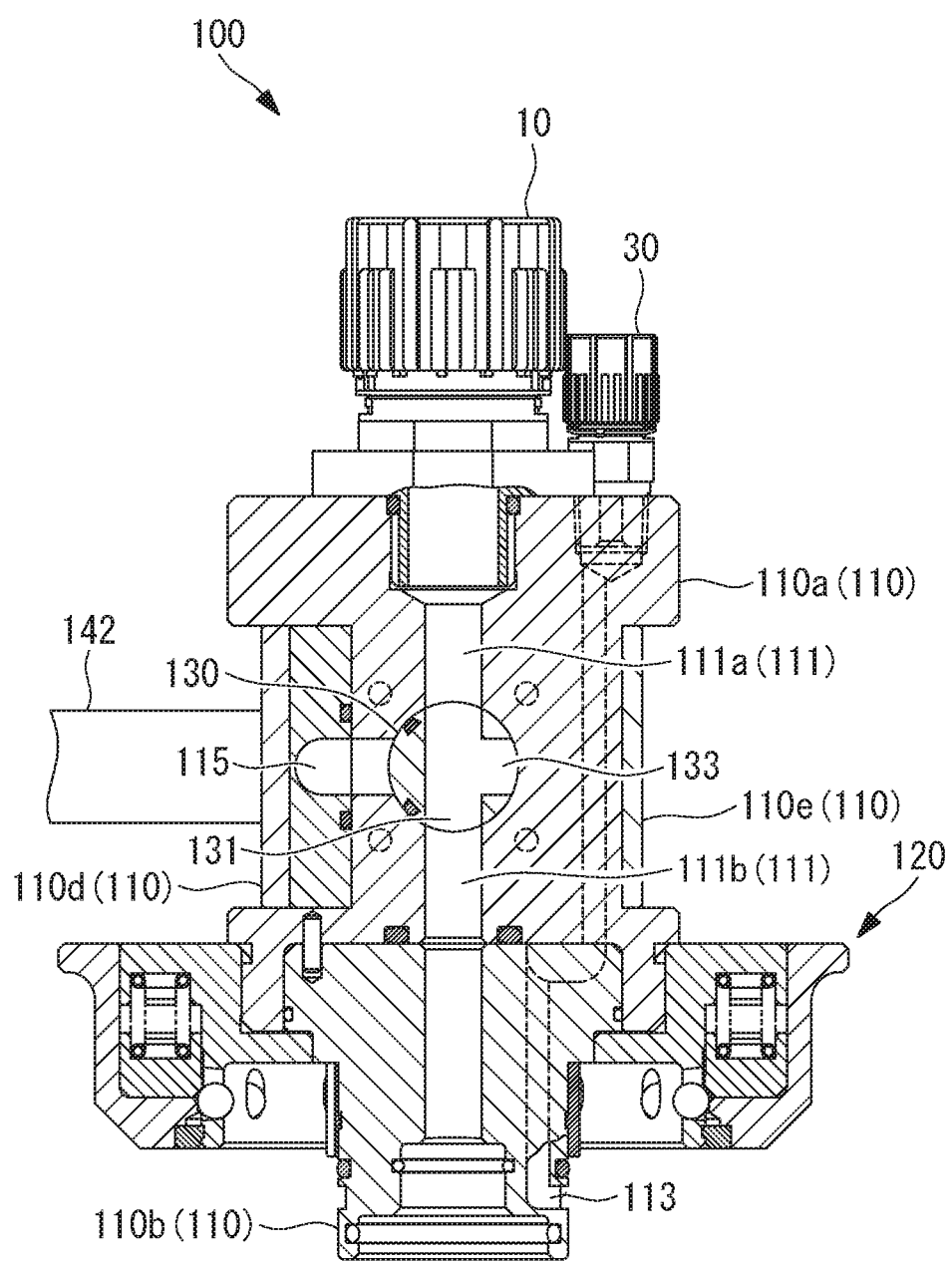
FIG. 13 is a partial sectional view of the socket as viewed along a line D-D shown in FIG. 12.

As shown in FIGS. 12 and 13, when the rotary valve 130 is in the open state, the outflow through-hole 131, the upstream-side outflow passage 111b, and the downstream-side outflow passage 111a communicate with each other, and the inflow through-hole 132, the upstream-side inflow passage 112a, and the downstream-side inflow passage 112b communicate with each other.

As shown in FIGS. 12 and 13, when the rotary valve 130 is in the open state, the outflow through-hole 131 and the communication hole 115 do not communicate with each other. Similarly, when the rotary valve 130 is in the open state, the inflow through-hole 132 and the communication hole 115 do not communicate with each other.

Figure 14:
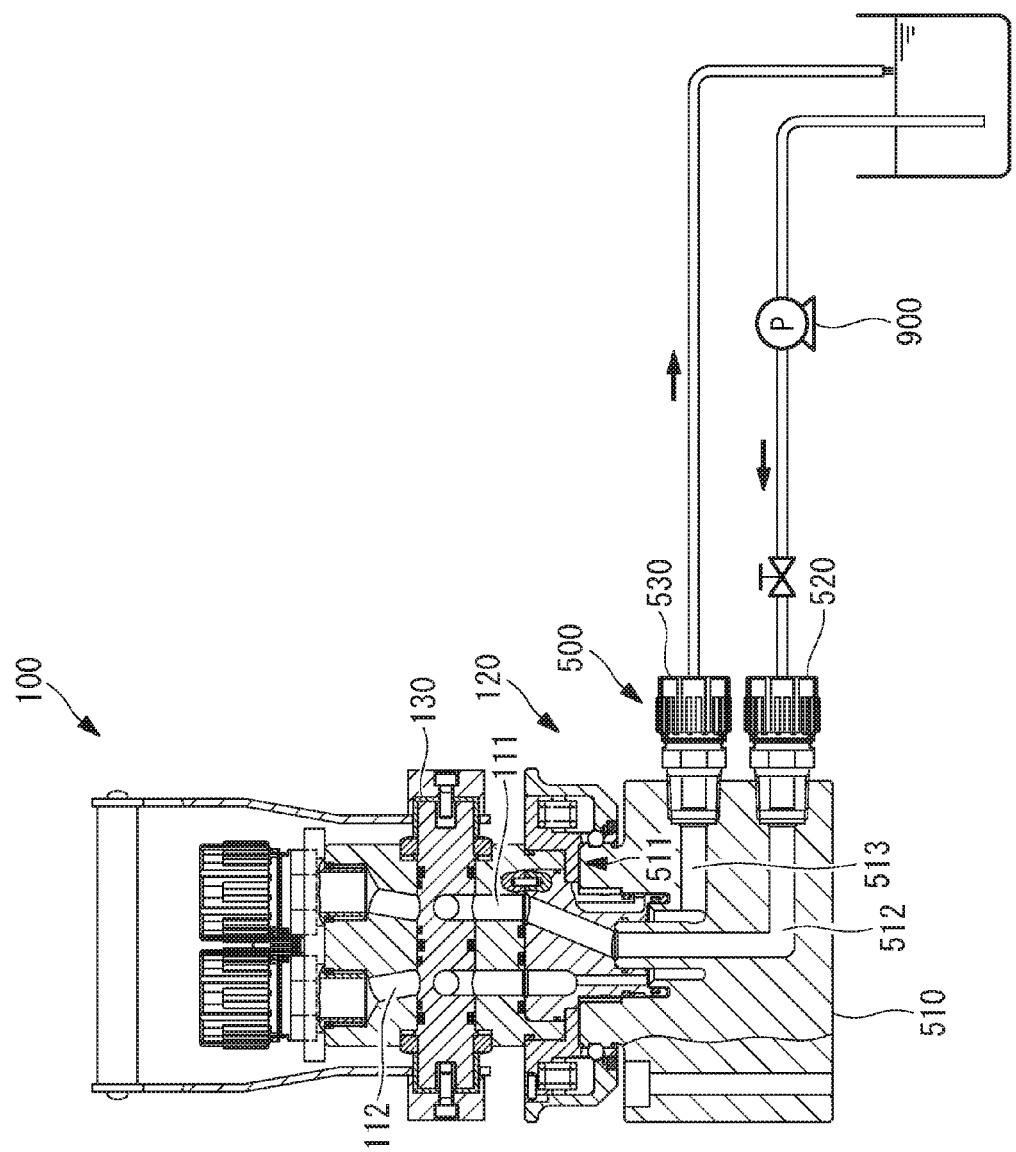
FIG. 14 is a structural diagram showing a socket cleaning system.

Next, the socket cleaning device 500 that cleans the socket 100 according to this embodiment will be described with reference to FIG. 14.

The socket cleaning device 500 is a device for cleaning the liquid remaining in the socket 100 when the rotary valve 130 is in the closed state. The socket cleaning device 500 includes a body portion 510, an inflow port 520, and a discharge port 530.

The body portion 510 includes an opening 511 to which the socket 100 is attached, an inflow passage 512 that communicates with the second liquid outflow passage 111 in the state where the socket 100 is attached, and an outflow passage 513 that communicates with the second liquid inflow passage 112 in the state where the socket 100 is attached.

An engagement groove is formed in the outer peripheral surface of the opening 511. The lock ball mechanism 120 of the socket 100 can be fixed to the engagement groove.

The socket 100 is attached to the opening 511 of the socket cleaning device 500 and the rotary valve 130 is switched to the closed state, as shown in FIG. 9, so that the second liquid outflow passage 111 and the second liquid inflow passage 112 communicate with each other via the communication hole 115. When the liquid for cleaning (such as purified water) is supplied from a supply source to the inflow port 520 by the pump 900 while the rotary valve 130 is kept in the closed state, the liquid flows in from the inflow passage 512 to the second liquid outflow passage 111. The liquid flowing into the second liquid outflow passage 111 flows into the second liquid inflow passage 112 via the communication hole 115 and is guided to the outflow passage 513. The liquid guided to the outflow passage 513 flows out from the discharge port 530 and is returned to the supply source again.

The socket cleaning device 500 circulates the cleaning solution in the socket 100 in the manner as described above, thereby cleaning the upstream-side outflow passage 111b, the discharge hole 133, the outflow through-hole 131, the inflow through-hole 132, the discharge hole 134, the downstream-side inflow passage 112b, and the communication hole 115 of the socket 100.

The operation and effect provided by the connector 300 of this embodiment described above will be described.

According to the connector 300 of this embodiment, in the state where the socket 100 is attached to the plug 200, the liquid is sucked by the pump 600 and the liquid drawn out from the first liquid outflow passage 211 of the plug 200 flows to the outside via the second liquid outflow passage 111 of the socket 100. Further, the liquid circulated by the external pump 600 is guided into the liquid storing container 400 from the first liquid inflow passage 212 of the plug 200 via the second liquid inflow passage 112 of the socket 100. Furthermore, an outside air to be replaced by an amount corresponding to the decreased amount of liquid stored in the liquid storing container 400 is guided to the inside space S1 of the liquid storing container 400 from the outside space S2 thereof via the second gas passage 113 of the socket 100 and the first gas passage 213 of the plug 200.

In this manner, the connector 300 according to this embodiment has a structure capable of causing the liquid stored in the liquid storing container 400 to flow to the outside, causing the liquid that has flown to the outside and circulated to flow into the liquid storing container 400, and introducing an outside air corresponding to the decreased amount of liquid stored in the liquid storing container 400.

According to the connector 300 of this embodiment, the switching mechanism 140 switches the rotary valve 130 to the open state or the closed state, thereby making it possible to switch between the open state and the closed state. The open state is a state in which the liquid circulates in the second liquid outflow passage 111 and the second liquid inflow passage 112 via the outflow through-hole 131 and the inflow through-hole 132. The closed state is a state in which the liquid does not circulate in the second liquid outflow passage 111 and the second liquid inflow passage 112 via the outflow through-hole 131 and the inflow through-hole 132.

Accordingly, it is possible to prevent defects, such as the accumulation of solid particles at the section where the passage sectional area decreases locally, the deterioration in the liquidity of the liquid, and such a defect that solid particles adhere to the urging mechanism of the valve body, which makes it difficult to smoothly open and close the valve.

Further, since the rotary valve 130 is switched to the closed state by the switching mechanism 140, the liquid remaining in the socket 100 can be prevented from flowing to the outside when the socket 100 is detached from the plug 200.

According to the connector 300 of this embodiment, when the switching mechanism 140 switches the rotary valve 130 to the closed state, the liquid remaining in the outflow through-hole 131 is guided to the upstream-side outflow passage 111*b* via the discharge hole 133, and is further guided to the liquid storing container 400 via the plug 200. Further, the liquid remaining in the inflow through-hole 132 is guided to the downstream-side inflow passage 112*b* via the discharge hole 134, and is further guided to the liquid storing container 400 via the plug 200. Accordingly, even when the liquid stored in the liquid storing container 400 is a slurry containing solid particles, such a defect that the solid particles remain in the outflow through-hole 131 and the inflow through-hole 132 and are coagulated can be prevented from occurring.

In the connector 300 of this embodiment, the socket body 110 has the communication hole 115 that allows the outflow through-hole 131 and the inflow through-hole 132 to communicate with each other, when the switching mechanism 140 switches the rotary valve 130 to the closed state.

With this structure, the liquid passage is formed to allow the second liquid outflow passage 111, the outflow through-hole 131, the communication hole 115, the inflow through-hole 132, and the second liquid inflow passage 112 to communicate with each other in this order after the socket 100 is detached from the plug 200. The solid particles or the like remaining in the socket 100 can be cleaned by circulating a liquid for cleaning, such as purified water, in the liquid passage.

OTHER EMBODIMENTS

In the above description, the liquid storing container 400 includes the opening 410 that is formed integrally with the container body 420 as shown in FIG. 1, but instead may have another aspect. For example, it is possible to use the liquid storing container 400 having a structure in which a cylindrical member (not shown) which is formed with a cylindrical shape about the axial line X1 is engaged with each engagement groove 411 in the outer peripheral surface of the opening 410 that is formed with a cylindrical shape integrally with the container body 420. In this case, the cylindrical member includes an engagement groove formed in the outer peripheral surface along the circumferential direction about the axial line X1. Further, the socket body 110 is fixed to the liquid storing container 400 in such a manner that the plurality of lock balls of the lock ball mechanism 120 are engaged with the engagement groove of the cylindrical member.

Thus, the opening of the liquid storing container 400 according to this embodiment includes the opening 410, which is formed with a cylindrical shape integrally with the container body 420, and the cylindrical member that is engaged with the outer peripheral surface thereof.

What is claimed is:

1. A connector to be attached to a liquid storing container having an opening formed in an upper surface thereof, the opening being formed with a cylindrical shape about a first axial line, the connector comprising:
    a plug to be fixed to the opening; and
    a socket to be detachably attached to the plug,
    wherein the plug includes a plug body including, formed therein, a first liquid outflow passage through which a liquid stored in the liquid storing container is drawn out; a first liquid inflow passage that guides the liquid flowing in from an outside of the liquid storing container into the liquid storing container; and a first gas passage that circulates an outside air between an inside space of the liquid storing container and an outside space of the liquid storing container, and
    wherein the socket includes:
        a socket body including, formed therein, a second liquid outflow passage through which the liquid drawn out from the first liquid outflow passage is caused to flow to the outside; a second liquid inflow passage that guides the liquid flowing in from the outside of the liquid storing container to the first liquid inflow passage; and a second gas passage connected to the first gas passage and causing the outside air to circulate between the inside space and the outside space, the socket body having a columnar insert hole formed along a second axial line so as to penetrate through the second liquid outflow passage and the second liquid inflow passage, the second axial line intersecting with the first axial line;
        a columnar rotary valve including an outflow through-hole and an inflow through-hole and inserted into the insert hole, the outflow through-hole being formed at a location where the second liquid outflow passage is disposed on the second axial line, the inflow through-hole being formed at a location where the second liquid inflow passage is disposed on the second axial line; and
        a switching mechanism that switches between an open state and a closed state when the rotary valve is rotated about the second axial line, the open state being a state in which the outflow through-hole and the second liquid outflow passage communicate with each other and the inflow through-hole and the second liquid inflow passage communicate with each other, the closed state being a state in which the outflow through-hole and the second liquid outflow passage do not communicate with each other and the inflow through-hole and the second liquid inflow passage do not communicate with each other.

2. The connector according to claim 1, wherein the rotary valve has a first discharge hole and a second discharge hole, the first discharge hole having one end opened to an outer peripheral surface of the rotary valve and the other end opened to the outflow through-hole, the second discharge hole having one end opened to the outer peripheral surface of the rotary valve and the other end opened to the inflow through-hole, and when the switching mechanism switches the rotary valve to the closed state, the first discharge hole communicates with the second liquid outflow passage below the outflow through-hole, and the second discharge hole communicates with the second liquid inflow passage below the inflow through-hole.

3. The connector according to claim 2, wherein the socket body has a communication hole for allowing the outflow through-hole and the inflow through-hole to communicate with each other when the switching mechanism switches the rotary valve to the closed state.

4. A socket to be attached to a liquid storing container having an opening formed in an upper surface thereof, the opening being formed with a cylindrical shape about a first axial line,
    the socket comprising:
        a socket body including, formed therein, a liquid outflow passage that causes a liquid drawn out from a plug fixed to the opening to flow to an outside; a liquid inflow passage that guides the liquid flowing in from the outside of the liquid storing container to the plug; and a gas passage that circulates an outside air between an inside space of the liquid storing container and an outside space of the liquid storing container, the socket body having a columnar insert hole formed along a second axial line so as to penetrate through the liquid outflow passage and the liquid inflow passage, the second axial line intersecting with the first axial line;

a columnar rotary valve having an outflow through-hole and an inflow through-hole and inserted into the insert hole, the outflow through-hole being formed at a location where the liquid outflow passage is disposed on the second axial line, the inflow through-hole being formed at a location where the liquid inflow passage is disposed on the second axial line; and a switching mechanism that switches between an open state and a closed state when the rotary valve is rotated about the second axial line, the open state being a state in which the outflow through-hole and the liquid outflow passage communicate with each other and the inflow through-hole and the liquid inflow passage communicate with each other, the closed state being a state in which the outflow through-hole and the liquid outflow passage do not communicate with each other and the inflow through-hole and the liquid inflow passage do not communicate with each other.

\* \* \* \* \*